(12) United States Patent
Pyi (10) Patent No.: US 7,189,597 B2
(45) Date of Patent: Mar. 13, 2007

(54) SEMICONDUCTOR DEVICE AND METHOD FOR FABRICATING THE SAME

(75) Inventor: Seung-Ho Pyi, Ichon-shi (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 0 days.

(21) Appl. No.: 11/023,348

(22) Filed: Dec. 29, 2004

(65) Prior Publication Data

US 2006/0014372 A1 Jan. 19, 2006

(30) Foreign Application Priority Data

Jul. 14, 2004 (KR) .................. 10-2004-0054712

(51) Int. Cl.
*H01L 21/00* (2006.01)
(52) U.S. Cl. ............... 438/118; 438/597; 438/622; 438/624
(58) Field of Classification Search ............... 438/118, 438/597, 624, 622; 257/758, 208
See application file for complete search history.

(56) References Cited

U.S. PATENT DOCUMENTS

| | | | | |
|---|---|---|---|---|
| 5,929,469 A | * | 7/1999 | Mimoto et al. | 257/208 |
| 6,329,281 B1 | * | 12/2001 | Lytle et al. | 438/624 |
| 6,844,600 B2 | * | 1/2005 | McQueen | 257/382 |
| 6,962,771 B1 | * | 11/2005 | Liu et al. | 430/317 |
| 2005/0085070 A1 | * | 4/2005 | Park | 438/643 |

FOREIGN PATENT DOCUMENTS

| KR | 1997-0054004 | 10/1997 |
|---|---|---|
| KR | 1998-066718 | 10/1998 |

OTHER PUBLICATIONS

Korean Office Action, Dec. 16, 2005.

* cited by examiner

*Primary Examiner*—Doug Menz
(74) *Attorney, Agent, or Firm*—McDermott Will & Emery LLP (57) ABSTRACT

The present invention relates to a semiconductor device with an improved contact margin between an interconnection line and a bit line and a method for fabricating the same. The semiconductor device includes: a bit line structure formed on a substrate and having a number of bit lines and a pad; a first inter-layer insulation layer formed on the bit line structure and the substrate and having a first opening exposing the pad; a conductive layer formed on the first inter-layer insulation layer and patterned to be a middle pad filled into the first opening and a plate electrode of a capacitor; a second inter-layer insulation layer formed on the first inter-layer insulation layer and the patterned conductive layer and having a second opening exposing the middle pad; and a metal layer filled into the second opening to form an interconnection line contacted to the pad.

4 Claims, 8 Drawing Sheets

SEMICONDUCTOR DEVICE AND METHOD FOR FABRICATING THE SAME

FIELD OF THE INVENTION

The present invention relates to a semiconductor device and a method for fabricating the same; and more particularly, to a semiconductor device with a contact for connecting an interconnection line to a bit line and a method for fabricating the same.

DESCRIPTION OF RELATED ARTS

A contact formation with use of a metal is an essential technology for fabricating a semiconductor device with a multi-layered structure. This metal contact becomes the basis for a vertical interconnection line between a top conductive layer and a bottom conductive layer. Meanwhile, a large scale of integration has led to a high increase in device density that allows several millions of transistors to exist per unit cell area measured in $cm^2$. As the semiconductor device has been increasingly scaled down, the size of the unit cell becomes smaller and as a result, the size of the contact for connecting an interconnection line that supplies power with a node that receives power becomes smaller as well. An expected value of a response rate with respect to a required signal is also increased as much as the scale of the device integration. Therefore, it is required to have a contact resistance of the down-sized contact that is less than a critical value. For this reason, the importance of a metal contact formation process has been greatly highlighted.

As the size of a dynamic random access memory (DRAM) device has been smaller, the size of a contact for use in a metal interconnection line for providing a power to a bit line has been proportionally smaller. In addition to the down-scaled contact for use in the metal interconnection line, the size of a bit line pad for transmitting a power to the bit line is adversely affected when adjacent bit lines are connected with each other. Hence, it is difficult to increase the size of the bit line pad, thereby resulting in another difficulty in increasing the size of a contact node with respect to the metal interconnection line.

Figure 1:
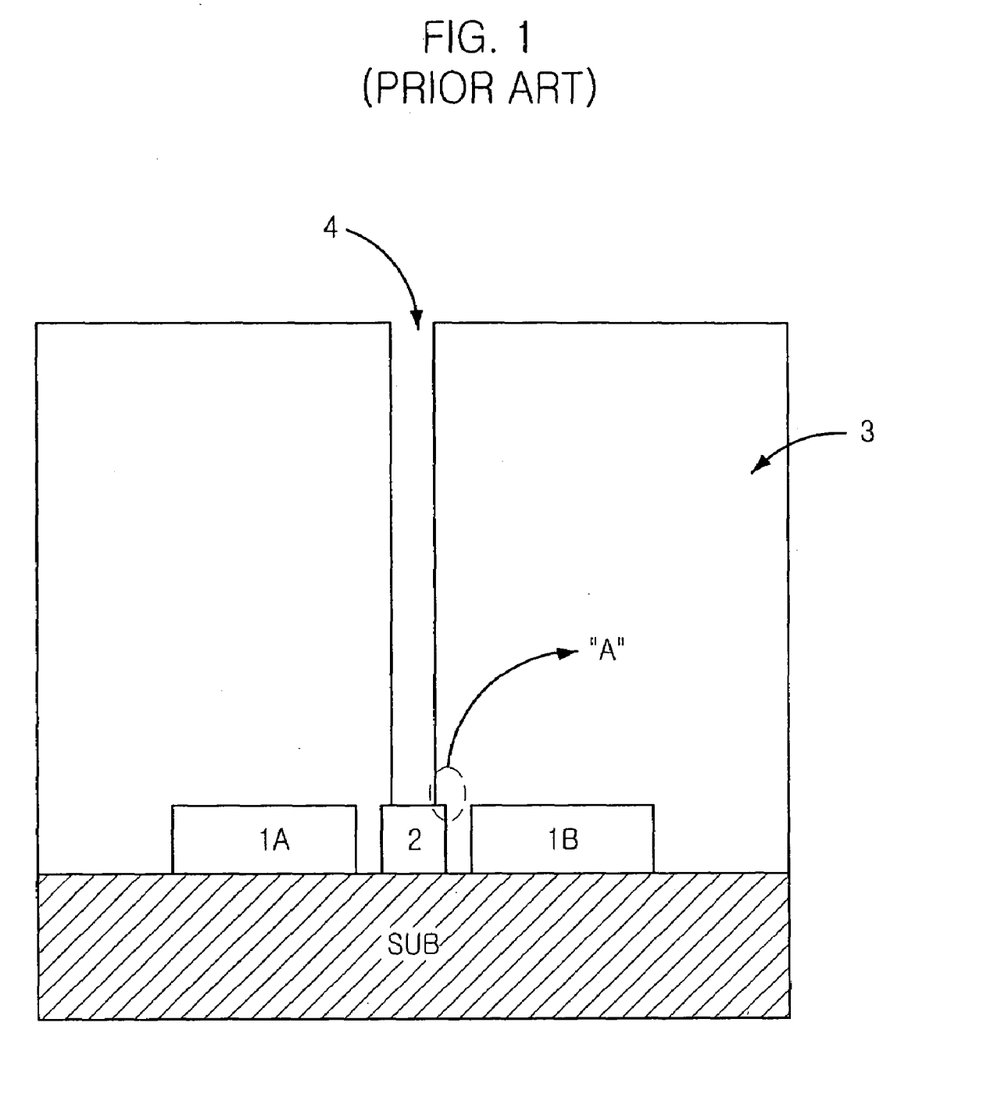
FIG. 1 is a cross-sectional view showing a conventional bit line pad on which a contact for use in a metal interconnection line is formed.

FIG. 1 is a cross-sectional view showing a conventional contact for use in a metal interconnection line formed on a down-sized bit line pad. A number of bit lines 1A and 1B are formed on a substrate SUB. At this time, a spacing distance between the bit lines 1A and 1B is very small. As a result of this fine spacing distance between the bit lines 1A and 1B, a bit line pad 2 is formed in a limited area with small size. As shown a reference denotation A, because of this down-sized bit line pad 2, the size of a contact 4 is also limited. Also, as the scale of device integration increases, it is necessary to increase the height of a capacitor in order to obtain an intended level of capacitance per cell that is equal to or greater than the capacitance of a previous semiconductor device. Therefore, an inter-layer insulation layer 3 is thickly formed, and this thickened inter-layer insulation layer 3 makes a depth of the contact 4 increase. For these reasons, there may be a problem that the contact 4 for use in the metal interconnection line is formed on the bit line pad 2 with difficulty.

SUMMARY OF THE INVENTION

It is, therefore, an object of the present invention to provide a semiconductor device with an improved contact margin between a metal interconnection line and a bit line even in demands of scaling-down and high integration and a method for fabricating the same.

In accordance with an aspect of the present invention, there is provided a semiconductor device, including: a bit line structure being formed on a substrate and having a number of bit lines and a pad; a first inter-layer insulation layer being formed on the bit line structure and the substrate and having a first opening exposing the pad; a conductive layer being formed on the first inter-layer insulation layer and being patterned to be a middle pad filled into the first opening and a plate electrode of a capacitor; a second inter-layer insulation layer being formed on the first inter-layer insulation layer and the patterned conductive layer and having a second opening exposing the middle pad; and a metal layer being filled into the second opening to thereby form an interconnection line contacted to the pad.

In accordance with another aspect of the present invention, there is provided a method for fabricating a semiconductor device, including the steps of: forming a bit line structure including bit lines and a pad on a substrate; forming a first inter-layer insulation layer having a first opening exposing the pad on the bit line structure and the substrate; forming a conductive layer on the first inter-layer insulation layer; patterning the conductive layer to thereby obtain a middle pad filled into the first opening and a plate electrode of a capacitor; forming a second inter-layer insulation layer having a second opening exposing the middle pad on the patterned conductive layer and the first inter-layer insulation layer; and filling a metal layer into the second opening to thereby obtain an interconnection line to which the pad is contacted.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

Hereinafter, a semiconductor device and a method for fabricating the same in accordance with a preferred embodiment of the present invention will be described in detail with reference to the accompanying drawings.

Figure 2:
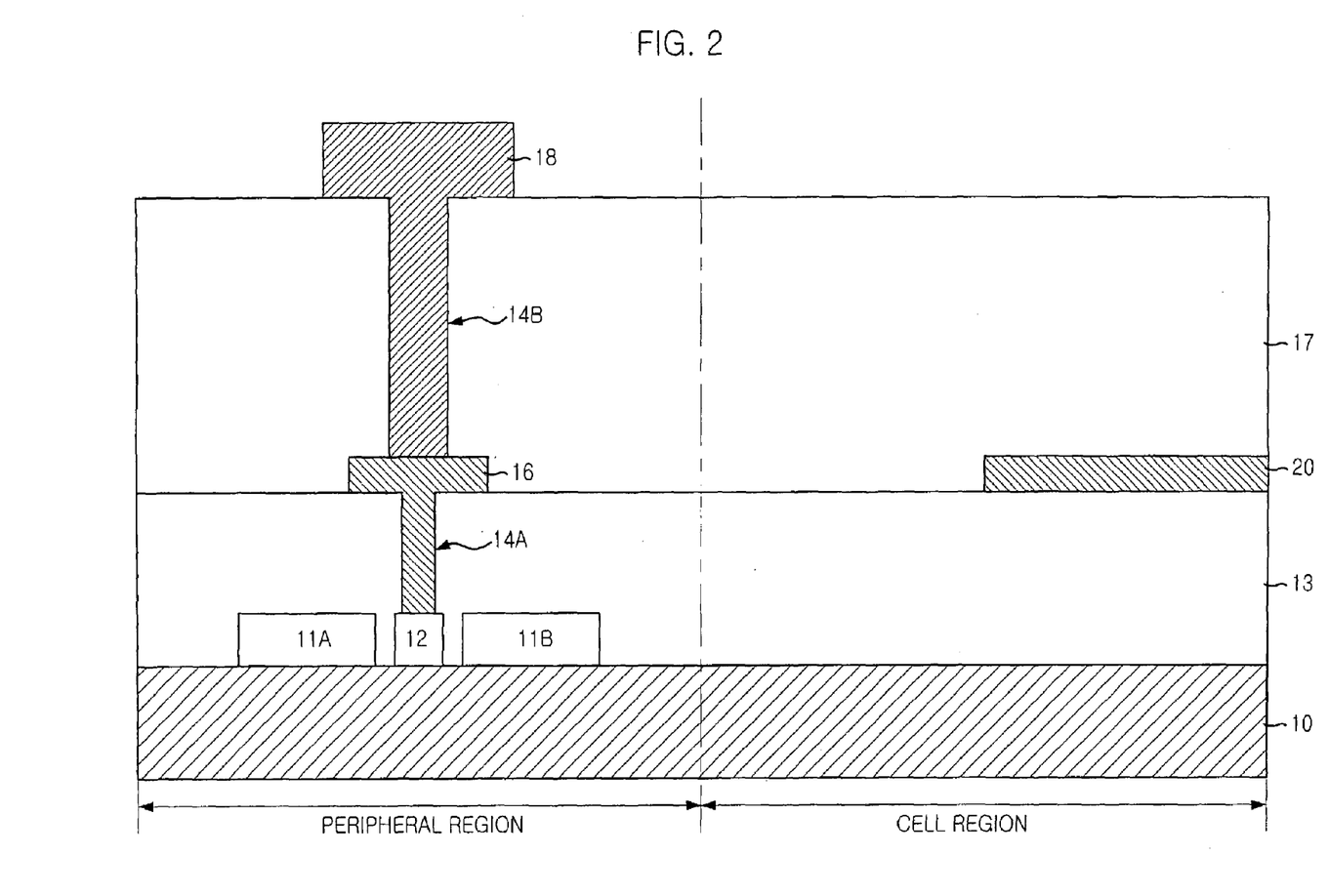
FIG. 2 is a cross-sectional view showing a semiconductor device in accordance with a preferred embodiment of the present invention.

FIG. 2 is a cross-sectional view showing a semiconductor device fabricated in accordance with the present invention.

As shown, a number of bit lines 11A and 11B are formed on a substrate 10 on which a pad 12 to which an interconnection line is contacted is formed. A first inter-layer insulation layer 13 is formed on the substrate 10. At this time, the first inter-layer insulation layer 13 has a first opening 14A exposing the pad 12.

A conductive layer for forming a middle pad 16 filled into the first opening 14A of the first inter-layer insulation layer 13 is patterned on the first inter-layer insulation layer 13. Herein, the conductive layer is based on a metal, and thus, the middle pad 16 and the plate electrode 20 exhibit conductivities. Also, the middle pad 16 is filled into the first opening 14A and simultaneously extends towards an upper part of the first inter-layer insulation layer 13. The middle pad 16 is formed in a peripheral region of a dynamic random access memory (DRAM) device, while the plate electrode 20 is formed in a cell region of the DRAM device.

Next, there is formed a second inter-layer insulation layer 17 on the above resulting substrate structure. At this time, the second inter-layer insulation layer 17 has a second opening 14B exposing the middle pad 16. The size of the second opening 14B is larger than that of the first opening 14A.

A metal layer 18 for use in an interconnection line is filled into the second opening 14B of the second inter-layer insulation layer 17.

FIGS. 3A to 3F are cross-sectional views illustrating a method for fabricating a semiconductor device in accordance with the preferred embodiment of the present invention. Herein, the same reference numerals are used for the same configuration elements described in FIG. 2.

Figure 3A:
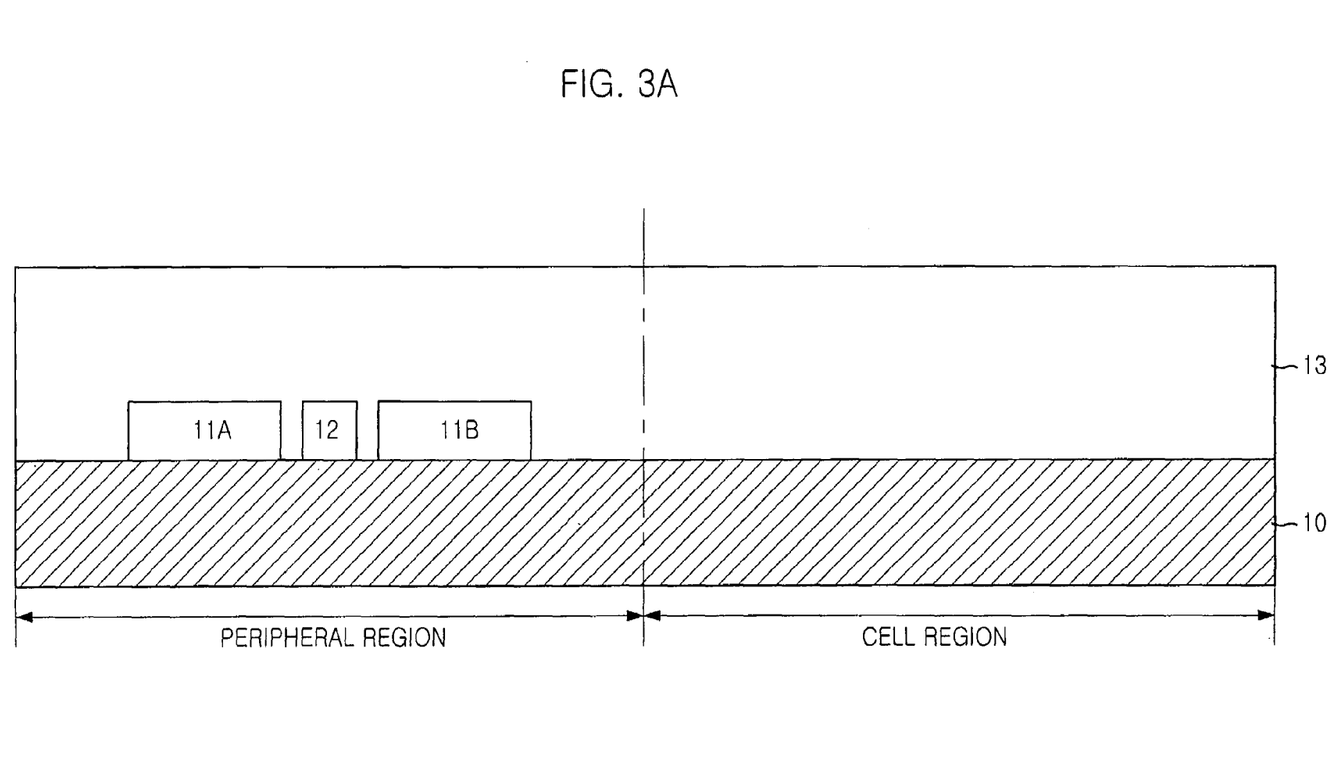
FIGS. 3A to 3F are cross-sectional views illustrating a method for fabricating a semiconductor device in accordance with the preferred embodiment of the present invention.

Referring to FIG. 3A, a number of bit lines 11A and 11B are formed on a substrate 10 on which a pad 12 is formed, and a first inter-layer insulation layer 13 is formed thereon. Herein, the pad 12 is a bit line pad.

Figure 3B:
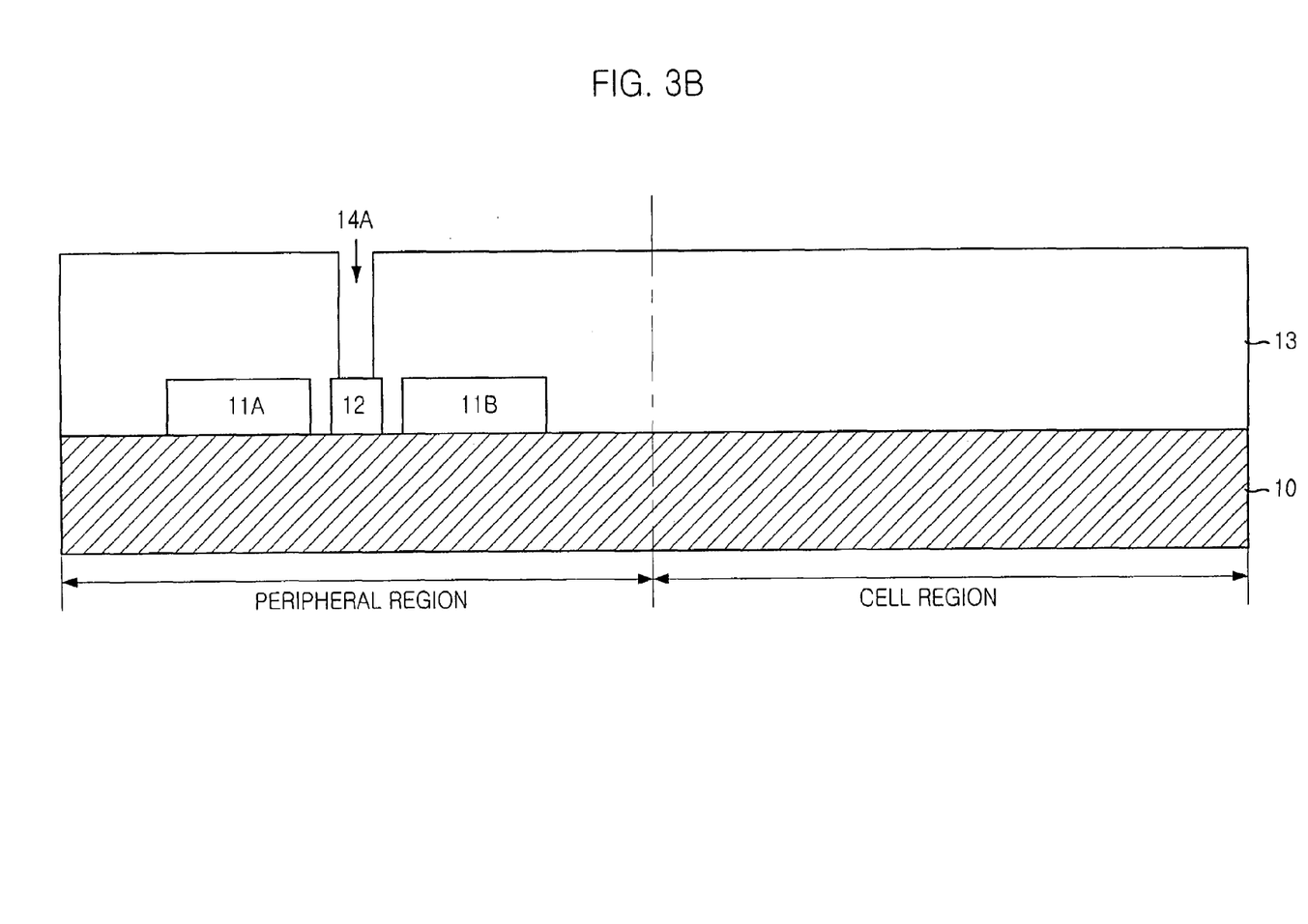

Referring to FIG. 3B, the first inter-layer insulation layer 13 is selectively etched to thereby form a first opening 14A exposing the pad 12.

Figure 3C:
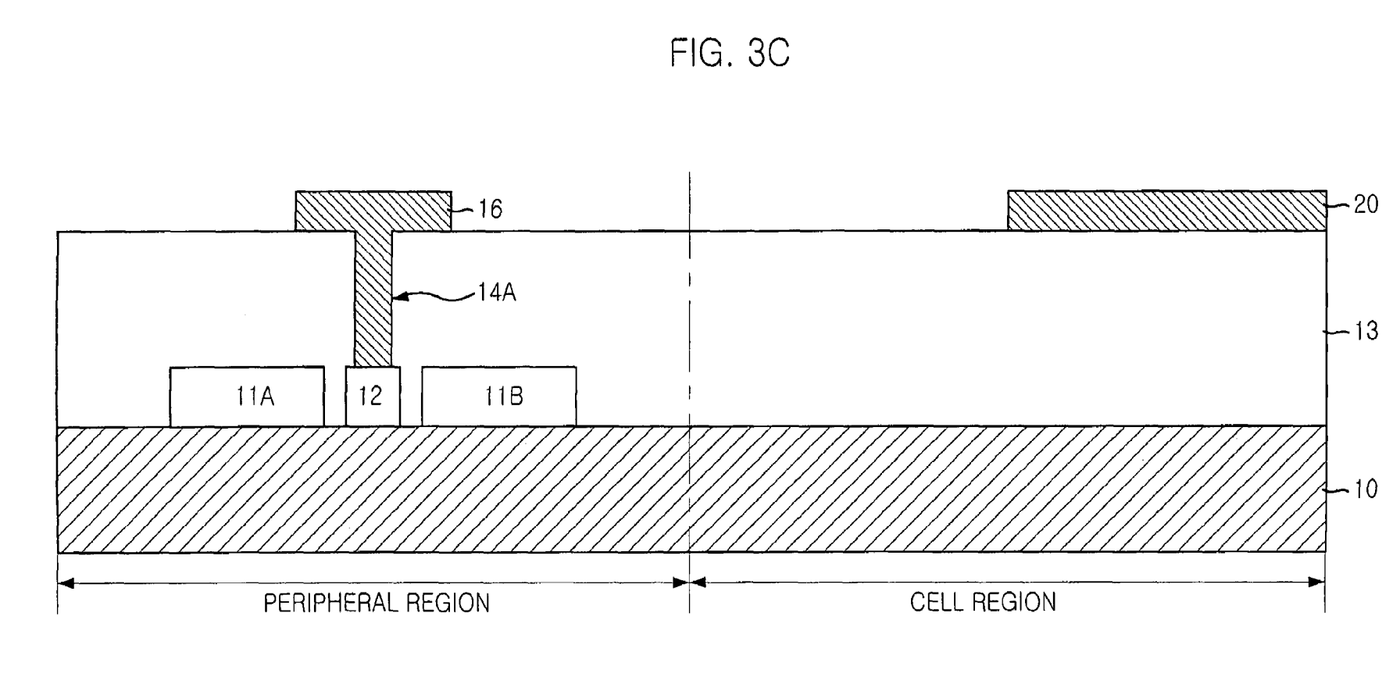

Referring to FIG. 3C, a thin conductive layer is formed on the first inter-layer insulation layer 13 and is then patterned to form a middle pad 16 filling the first opening 14A of the first inter-layer insulation layer 13 as simultaneously as to form a plate electrode 20 of a capacitor. Herein, the conductive layer is made of a metal.

Figure 3D:
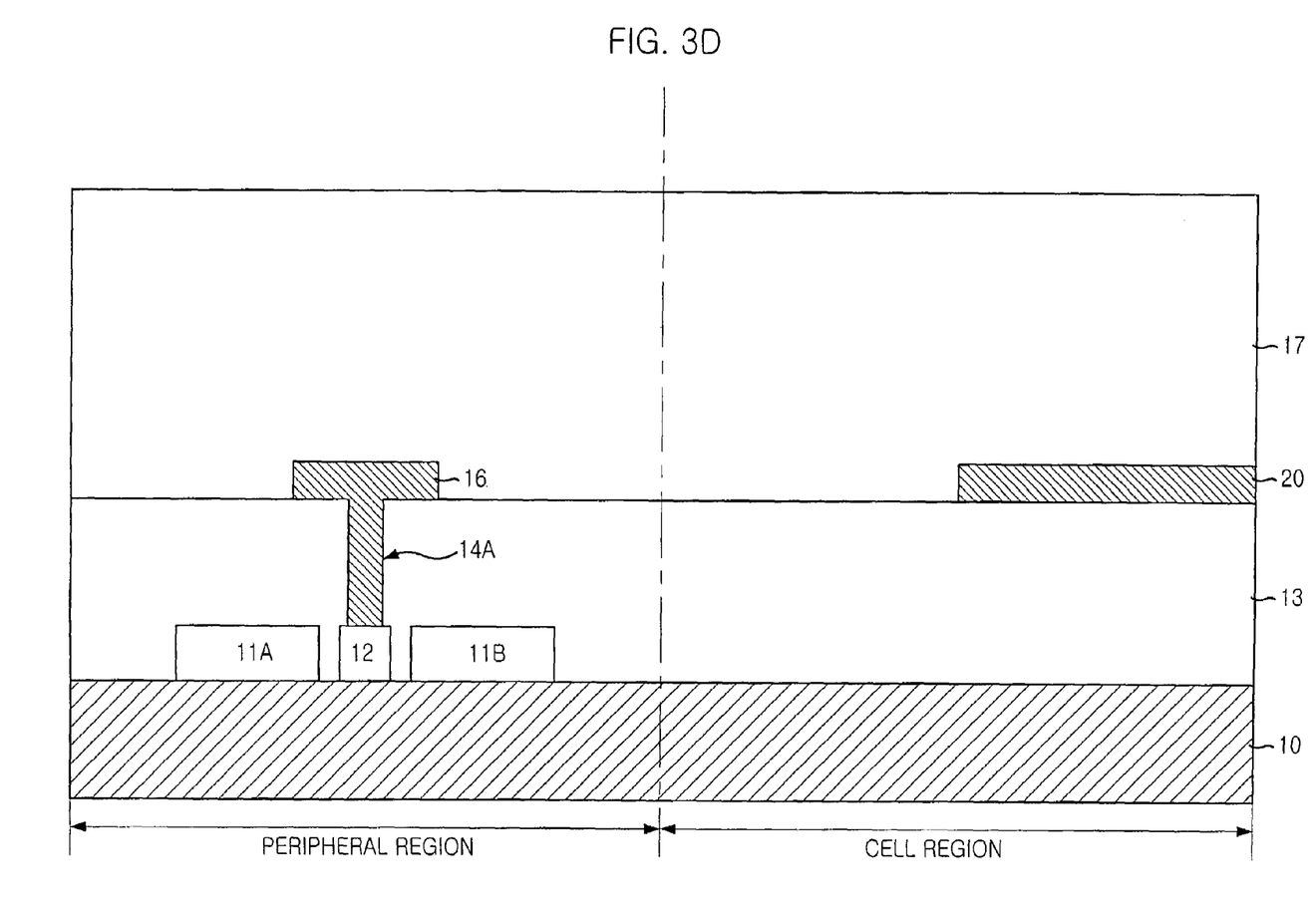

Referring to FIG. 3D, a second inter-layer insulation layer 17 is formed on the first inter-layer insulation layer 13, the middle pad 16 and the plate electrode 20. Herein, the middle pad 16 is formed in a peripheral region of a dynamic random access memory (DRAM) device, while the plate electrode 20 is formed in a cell region of the DRAM device.

Figure 3E:
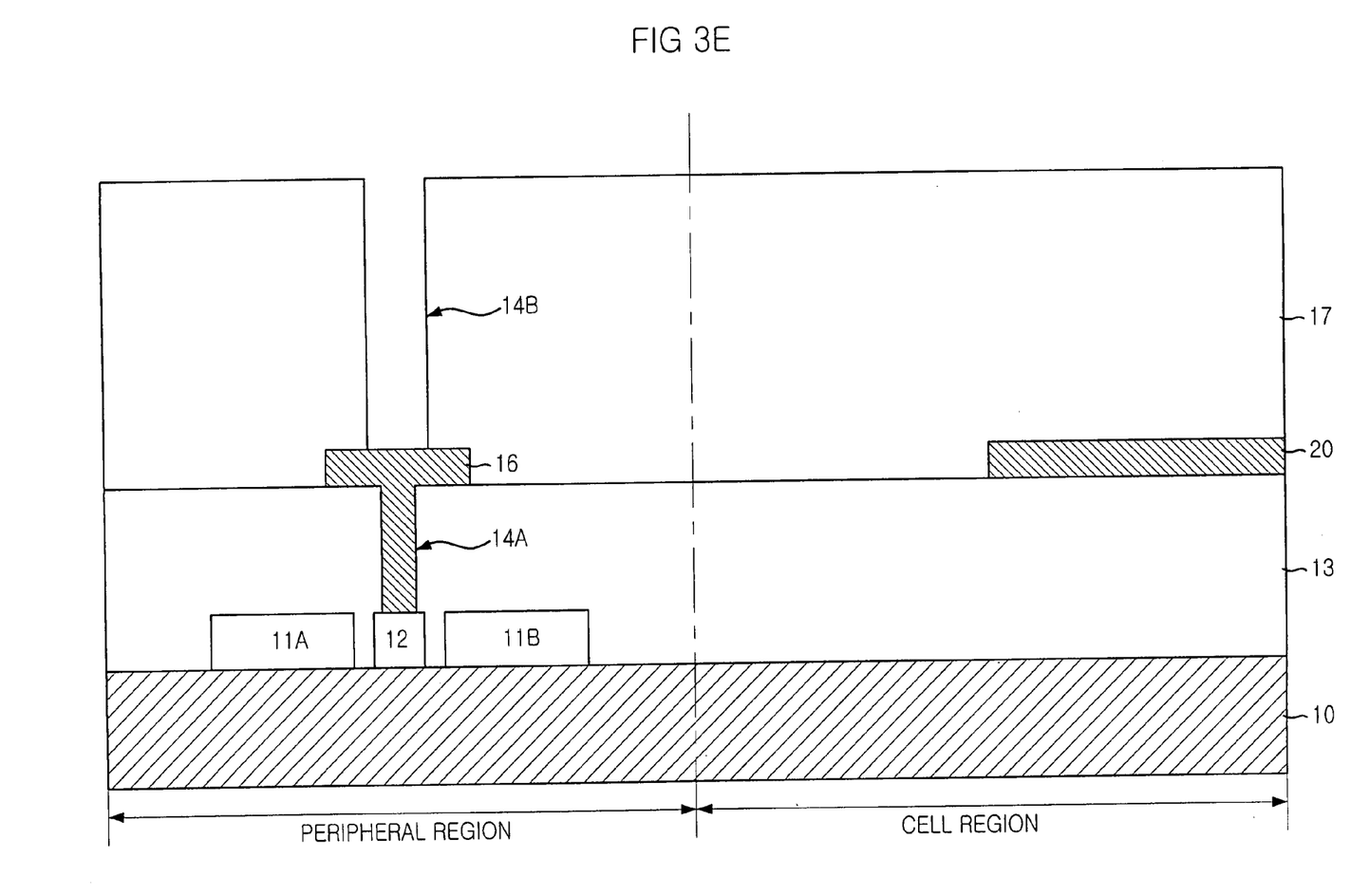

With reference to FIG. 3E, the second inter-layer insulation layer 17 is selectively etched to form a second opening 14B which connects the middle pad 16 with a metal interconnection line which will be formed subsequently. At this time, the second opening 14B is formed as large as the design rule of a semiconductor device allows.

Figure 3F:
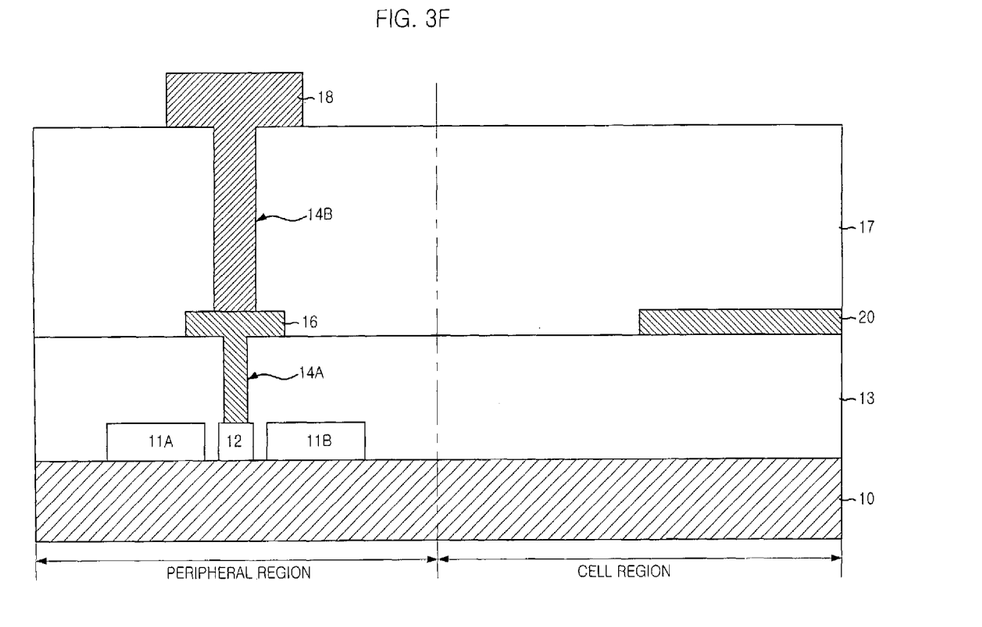

Afterwards, as shown in FIG. 3F, a metal layer is formed on the second inter-layer insulation layer 17 by filling the second opening 14B and then, patterned to form a metal interconnection line 18.

In accordance with the preferred embodiment of the present invention, the middle pad based on the same material employed for forming the plate electrode of the capacitor is formed on the pad, and then, the metal interconnection line is contacted to the middle pad. As a result of this specific structure, it is possible to form a wide contact between the metal interconnection line and the selected bit line, thereby further resulting in a decrease in a contact resistance and an improvement on stability of a metal interconnection line formation process.

The present application contains subject matter related to the Korean patent application No. KR 2004-0054712, filed in the Korean Patent Office on Jul. 14, 2004, the entire contents of which being-incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a semiconductor device, comprising the steps of:
    forming a bit line structure including bit lines and a bit line pad on a substrate;
    forming a first inter-layer insulation layer having a first opening exposing the bit line pad except for the bit lines;
    forming a middle pad on the first inter-layer insulation layer and in the first opening through a single deposition of a conductive layer and a single patterning process to the conductive layer;
    forming a second inter-layer insulation layer having a second opening exposing the middle pad; and
    filling a metal layer into the second opening to thereby obtain an interconnection line to which the bit line pad is connected.

2. The method of claim 1, wherein the conductive layer is made of a metal.

3. The method of claim 1, wherein the second opening of the second inter-layer insulation layer is larger than the first opening of the first inter-layer insulation layer.

4. The method of claim 1, wherein the middle pad is formed by being filled into the first opening as simultaneously as extending towards an upper part of the first inter-layer insulation layer.

* * * * *